(12) United States Patent
Horiuchi et al.

(10) Patent No.: US 11,747,862 B2
(45) Date of Patent: Sep. 5, 2023

(54) PORTABLE INFORMATION DEVICE AND DOUBLE-SIDED ADHESIVE TAPE

(71) Applicant: LENOVO (SINGAPORE) PTE. LTD., Singapore (SG)

(72) Inventors: Shigehiro Horiuchi, Yokohama (JP); Takehito Yamauchi, Yokohama (JP); Tetsuya Sano, Yokohama (JP); Yuta Tsuganezawa, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 475 days.

(21) Appl. No.: 17/164,659

(22) Filed: Feb. 1, 2021

(65) Prior Publication Data
US 2022/0137669 A1    May 5, 2022

(30) Foreign Application Priority Data

Nov. 5, 2020 (JP) .................................. 2020-185286

(51) Int. Cl.
*G06F 1/16* (2006.01)
*H05K 5/02* (2006.01)
(Continued)

(52) U.S. Cl.
CPC .............. *G06F 1/1656* (2013.01); *C09J 7/38* (2018.01); *C09J 7/403* (2018.01); *H05K 5/0243* (2013.01);
(Continued)

(58) Field of Classification Search
CPC .... G06F 1/1656; G06F 1/1616; G06F 1/1652; G06F 1/1658; G06F 1/1681;
(Continued)

(56) References Cited

U.S. PATENT DOCUMENTS 6,641,910 B1 * 11/2003 Bries .................... C09J 7/403
428/56
7,892,384 B2 * 2/2011 Bartusiak ................ B32B 3/00
156/196
(Continued)

FOREIGN PATENT DOCUMENTS

EP        3447101 A1 *  2/2019 ............... B32B 7/12
JP      2007202756 A    8/2007
(Continued)

*Primary Examiner* — Patricia L. Nordmeyer
(74) *Attorney, Agent, or Firm* — SHIMOKAJI IP

(57) ABSTRACT

A portable information device includes: a chassis; a decorative plate fixed to a part of an outer face of the chassis with stretch releasable double-sided adhesive tape; and a cover member that covers the outer face and the decorative plate. The double-sided adhesive tape has: an adhesive portion including adhesive layers on first and second faces of a substrate for adhesively fixing between the decorative plate and the outer face; and a tab including release paper partially covering the adhesive layers to let a user hold the tab for stretch release of the adhesive portion from between the decorative plate and the outer face. The double-sided adhesive tape has a first groove and a second groove on the first face and the second face, respectively, that are positioned not to overlap in a thickness direction of the substrate.

9 Claims, 10 Drawing Sheets

(51) Int. Cl.
*C09J 7/40* (2018.01)
*C09J 7/38* (2018.01)

(52) U.S. Cl.
CPC .... *C09J 2203/326* (2013.01); *C09J 2301/124* (2020.08); *C09J 2301/308* (2020.08); *C09J 2301/502* (2020.08)

(58) Field of Classification Search
CPC .. G06F 1/1613; C09J 7/38; C09J 7/403; C09J 2203/326; C09J 2301/124; C09J 2301/308; C09J 2301/502; C09J 2203/318; C09J 2301/302; C09J 201/02; C09J 7/10; C09J 7/25; C09J 7/20; C09J 2203/33; C09J 2301/18; C09J 2479/086; C09J 2467/006; C09J 2301/16; C09J 2421/00; H05K 5/0243; H05K 5/0086; H05K 13/0491; H05K 13/0486; A47G 1/175; B32B 7/12; H04M 1/026; H04M 1/0279; H04M 1/0262; H04W 88/00; Y02E 60/10; B29C 65/76; B29C 65/50; B29C 65/5057; F16B 11/006; Y10T 428/24273; Y10T 428/2419; Y10T 428/24777; Y10T 428/1476; Y10T 29/53909; Y10T 29/49945; Y10T 29/49822; B29L 2031/3481; B23P 19/04; B25B 27/00

See application file for complete search history.

(56) References Cited

U.S. PATENT DOCUMENTS

| | | | | |
|---|---|---|---|---|
| 9,333,706 | B2* | 5/2016 | Mag | H04M 1/0262 |
| 10,000,018 | B2* | 6/2018 | Mag | C09J 7/10 |
| 2014/0123459 | A1* | 5/2014 | Casebolt | B23P 19/04 |
| | | | | 29/525 |
| 2014/0355207 | A1* | 12/2014 | Stephens | H01M 10/425 |
| | | | | 361/679.55 |
| 2015/0064386 | A1* | 3/2015 | Mag | H04M 1/0279 |
| | | | | 428/192 |

FOREIGN PATENT DOCUMENTS

| | | | |
|---|---|---|---|
| JP | 2020135790 A | 8/2020 | |
| WO | WO-2021137135 A1 * | 7/2021 | ........... B32B 15/043 |

* cited by examiner

PORTABLE INFORMATION DEVICE AND DOUBLE-SIDED ADHESIVE TAPE

FIELD OF THE INVENTION

The present invention relates to a portable information device and double-sided adhesive tape that can be used to fix components of the portable information device.

BACKGROUND OF THE INVENTION

There is a strong demand for portable information devices such as a laptop PC and a tablet PC that have a slim chassis with sophisticated external design. To this end, the exterior components and interior components may be fixed with double-sided tape instead of screws (see, for example, Japanese Unexamined Patent Application Publication No. 2020-135790).

Such a configuration having the components fixed with double-sided tape, however, requires a user to forcibly peel off the double-sided tape when replacing components such as a display or a battery device or during various maintenance. During the peeling-off, the components and the chassis may be damaged, and the peeling-off work itself may be difficult in some cases. Japanese Patent Publication No. 5043340, for example, discloses a method for fixing components with double-sided adhesive tape that is releasable by stretching.

SUMMARY OF THE INVENTION

Typically, double-sided adhesive tape that is releasable by stretching has a portion (tab) to let a user pinch, and the tab is formed by covering a part of the adhesive layers on both faces with release paper. To release the tape, a user may pull this tab out to remove the tape from between the adhered components.

Such double-sided adhesive tape has groove-like dents that are formed along the edge of the release paper on the tab. These dents are formed in the manufacturing process of the tape and are on both faces of the tape. The conventional double-sided adhesive tape therefore breaks at the tab along the dents during releasing by stretching, and may not be completely removed.

In view of the problems of the conventional techniques, the present invention provides a portable information device including double-sided adhesive tape capable of suppressing a break of the tape during releasing by stretching, and such double-sided adhesive tape.

A portable information device according to one aspect of the present invention includes: a chassis; a decorative plate fixed to a part of an outer face of the chassis with double-sided adhesive tape that is releasable by stretching; and a cover member that covers the outer face of the chassis and the decorative plate. The double-sided adhesive tape has: an adhesive portion including adhesive layers on a first face and a second face of a substrate, the adhesive portion being configured to adhesively fix between the decorative plate and the outer face; and a tab including pieces of release paper covering a part of the adhesive layers on the first face and the second face of the substrate to let a user hold the tab for stretch release of the adhesive portion from between the decorative plate and the outer face. The tab projects from an edge of the decorative plate and is covered by the cover member. The first face has a first groove extending along a boundary line between the adhesive portion and the piece of release paper, and the second face has a second groove extending along a boundary line between the adhesive portion and the piece of release paper. The first groove and the second groove are positioned so as not to overlap each other in a thickness direction of the substrate.

A double-sided adhesive tape according to a second aspect of the present invention is releasable by stretching. The double-sided adhesive tape includes: an adhesive portion including adhesive layers on a first face and a second face of a substrate, the adhesive portion being configured to adhesively fix between two adhesive targets; and a tab including pieces of release paper covering a part of the adhesive layers on the first face and the second face of the substrate to let a user hold the tab for stretch release of the adhesive portion from between the two adhesive targets. The first face has a first groove extending along a boundary line between the adhesive portion and the piece of release paper, and the second face has a second groove extending along a boundary line between the adhesive portion and the piece of release paper. The first groove and the second groove are positioned so as not to overlap each other in a thickness direction of the substrate.

The above-described aspects of the present invention suppress a break of the tape during releasing by stretching.

DETAILED DESCRIPTION OF THE INVENTION

Figure 1:
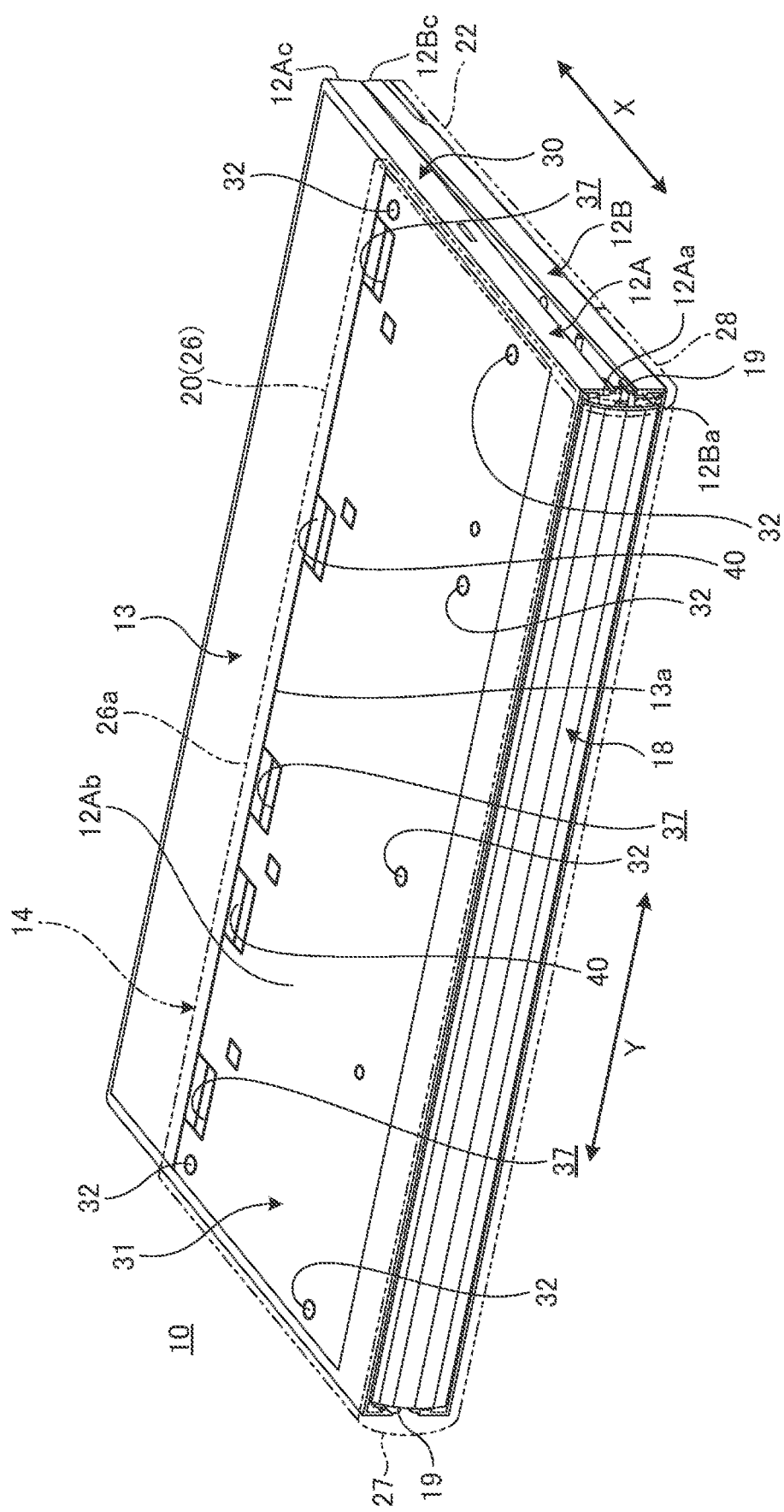
FIG. 1 is a perspective view illustrating a portable information device according to one embodiment when the portable information device is closed to be a folded form.

Referring to the drawings, the following describes a portable information device and double-sided adhesive tape according to the present invention in details by way of preferable embodiments.

Figure 2A:
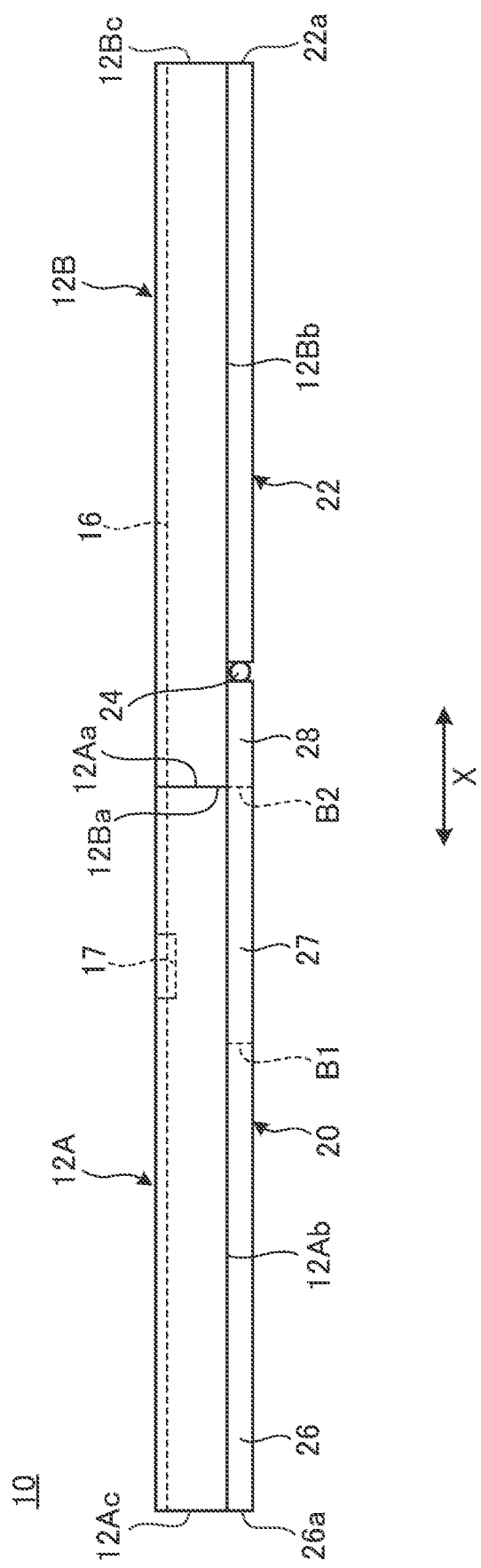
FIG. 2A is a side view schematically illustrating the portable information device of FIG. 1 when the portable information device is open to a flat plate form.
Figure 2B:
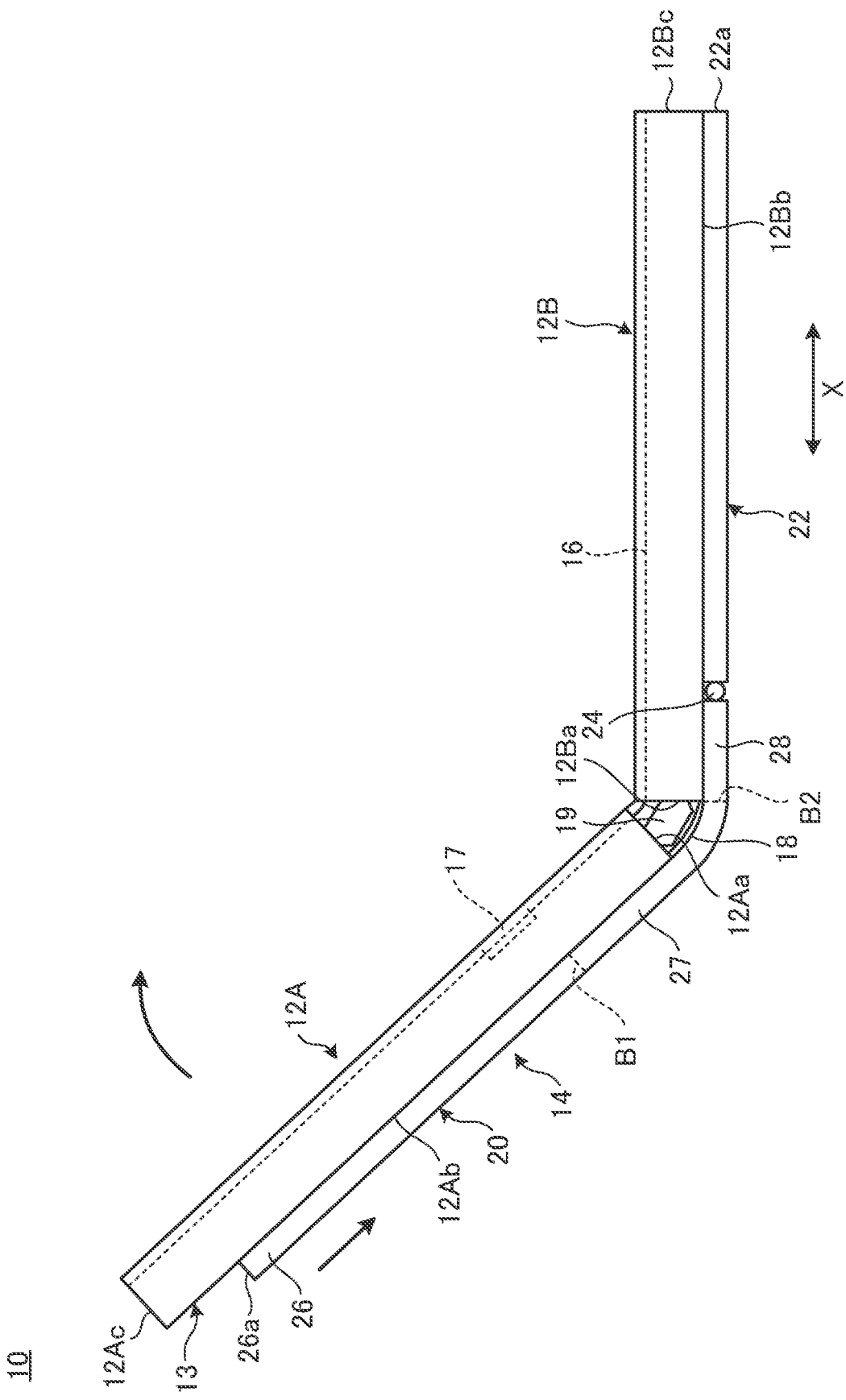
FIG. 2B is a side view of the portable information device of FIG. 2A in the laptop form.
Figure 2C:
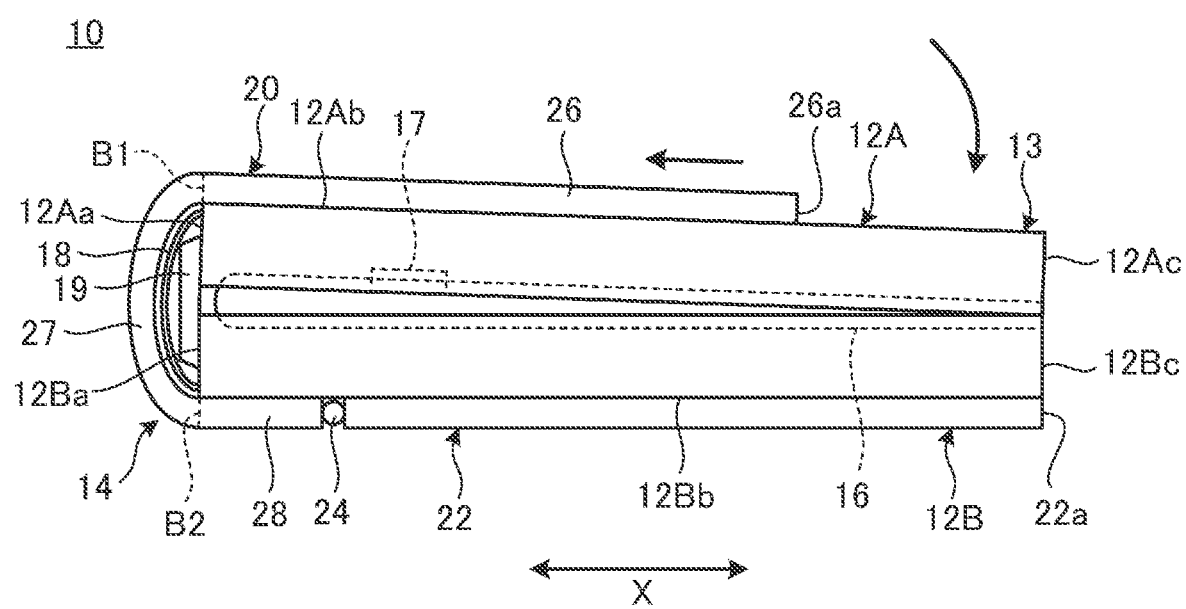
FIG. 2C is a side view of the portable information device of FIG. 2B when the portable information device is closed to be a folded form.

FIG. 1 is a perspective view illustrating a portable information device 10 according to one embodiment when the portable information device 10 is closed to be a folded form. FIG. 2A is a side view schematically illustrating the portable information device 10 of FIG. 1 when the portable information device 10 is open to a flat plate form. FIG. 2B is a side view of the portable information device 10 of FIG. 2A in the laptop form. FIG. 2C is a side view of the portable information device 10 of FIG. 2B when the portable information device 10 is closed to be a folded form.

As illustrated in FIGS. 1 to 2C, the portable information device 10 includes a first chassis 12A, a second chassis 12B, and a cover member 14. The portable information device 10 according to the present embodiment is a foldable tablet PC or laptop PC. The portable information device 10 may be a typical clamshell laptop PC, a single plate tablet PC, a smartphone, a portable game machine, or the like.

First, the overall configuration of the portable information device 10 will be described. The portable information device 10 includes the chassis 12A and 12B and a display 16.

The chassis 12A, 12B are placed adjacent to each other. Adjacent ends 12Aa and 12Ba of the chassis 12A and 12B are covered with a back part 18 from the inside. The chassis 12A and 12B are formed with rectangular plate-like members each having side walls standing on three sides other than the adjacent ends 12Aa and 12Ba. In one example, the chassis 12A and 12B each include a plate made of metal such as stainless steel, magnesium, or aluminum, or a fiber reinforced resin plate containing reinforcing fibers such as carbon fiber.

As illustrated in FIGS. 1 and 2, the portable information device 10 is described below while referring to the direction of placing the chassis 12A and 12B side by side as X direction, and the direction along the adjacent ends 12Aa and 12Ba and orthogonal to the X direction as Y direction.

In the chassis 12A, 12B, their mutually adjacent ends 12Aa and 12Ba are connected via a pair of hinges 19 and 19. The chassis 12A and 12B are connected via the hinges 19 so as to be relatively rotatable between the flat plate form illustrated in FIG. 2A and the folded form illustrated in FIG. 2C. In the flat plate form, the chassis 12A and 12B are disposed side by side in the direction (X direction) perpendicular to the plane direction to have a single plate form. In the folded form, the chassis 12A and 12B are folded on top of each other. The hinges 19 can generate a predetermined rotational torque. Therefore, the chassis 12A and 12B are stable even in the laptop form (see FIG. 2B) having the angle of about 90 to 140 degrees. In one example, the hinges 19 are placed at both ends in the Y direction of the adjacent ends 12Aa and 12Ba of the chassis 12A and 12B, and are located outside the outer peripheral edge of the display 16. The portable information device 10 of the present embodiment is configured so that the center of rotation of the chassis 12A and 12B via the hinges 19 coincides with the surface of the display 16.

These chassis 12A and 12B internally store a motherboard, various types of semiconductor chips mounted on the motherboard, such as a CPU, and various types of electronic components such as a communication module, a battery device, and a cooler. Reference numeral 17 in FIGS. 2A to 2C denotes a camera for imaging, and the camera faces the front through an opening in a bezel surrounding the display 16 on the surface of the first chassis 12A.

As illustrated in FIG. 1, an outer face 12Ab of the first chassis 12A comes with a decorative plate 13. The decorative plate 13 is a belt-like plate extending on the outer face 12Ab in the Y direction at a position along the open end 12Ac. In one example, the decorative plate 13 is black glass capable of transmitting light. In another example, the decorative plate 13 may be a resin plate or a metal plate. The first chassis 12A comes with a light emitting module 15 facing the outer face 12Ab (see FIG. 3B). The light emitting module 15 is a device called a smart light that notifies the operating state of the portable information device 10 or notifies a response to a user's call.

In one example, the display 16 is a touch-panel type liquid crystal display. The display 16 has a bending region that is a belt-like range extending in the Y direction over the adjacent ends 12Aa and 12Ba. This allows the display 16 to be folded together with the chassis 12A and 12B when the chassis are folded, and so the display 16 is open and is closed with the opening and closing operation of the chassis 12A and 12B. In one example, the display 16 is a flexible display such as an organic electro luminescence (EL) having a highly flexible paper structure.

Figure 3A:
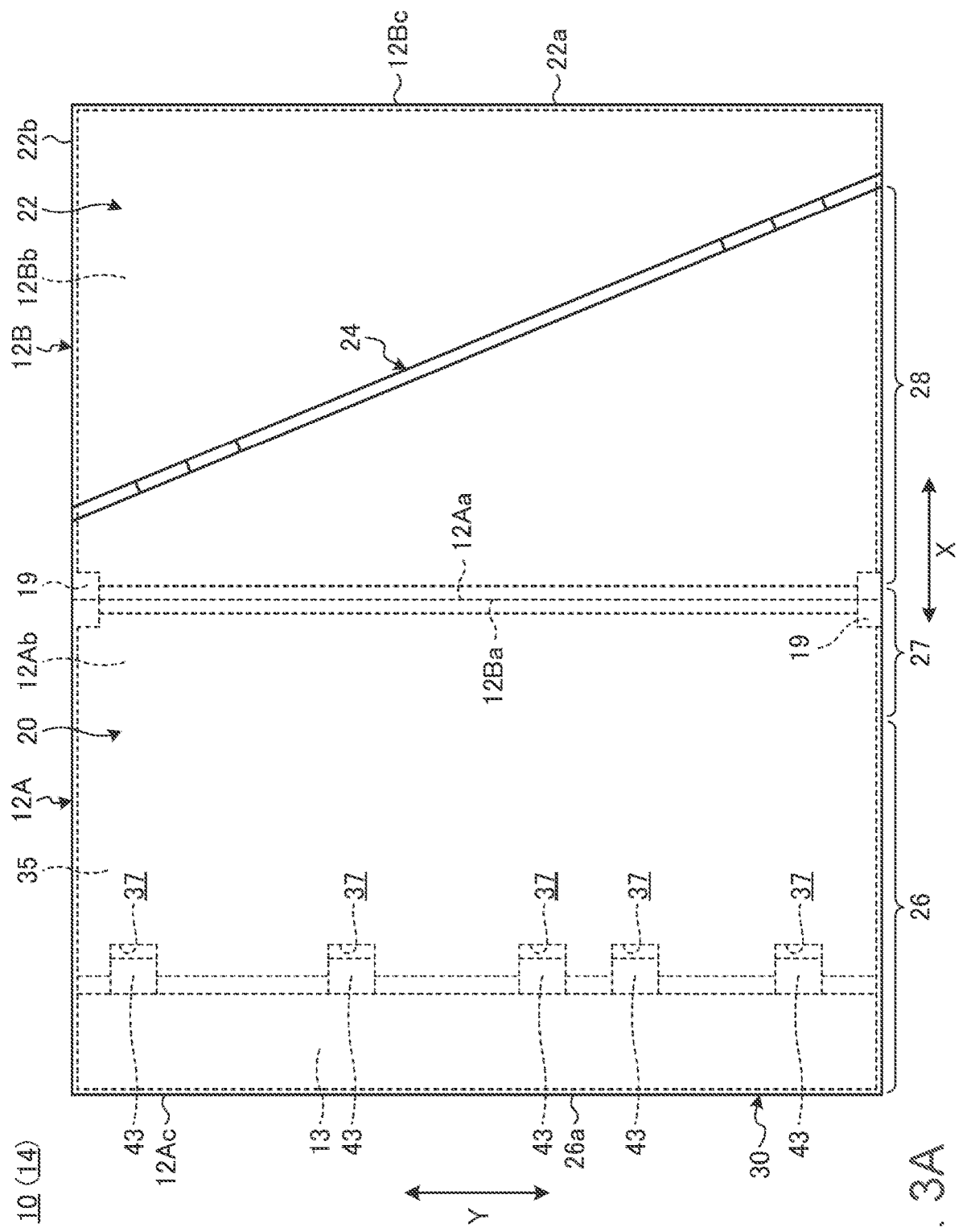
FIG. 3A is a plan view of the portable information device in the flat plate form viewed from the cover member.
Figure 3B:
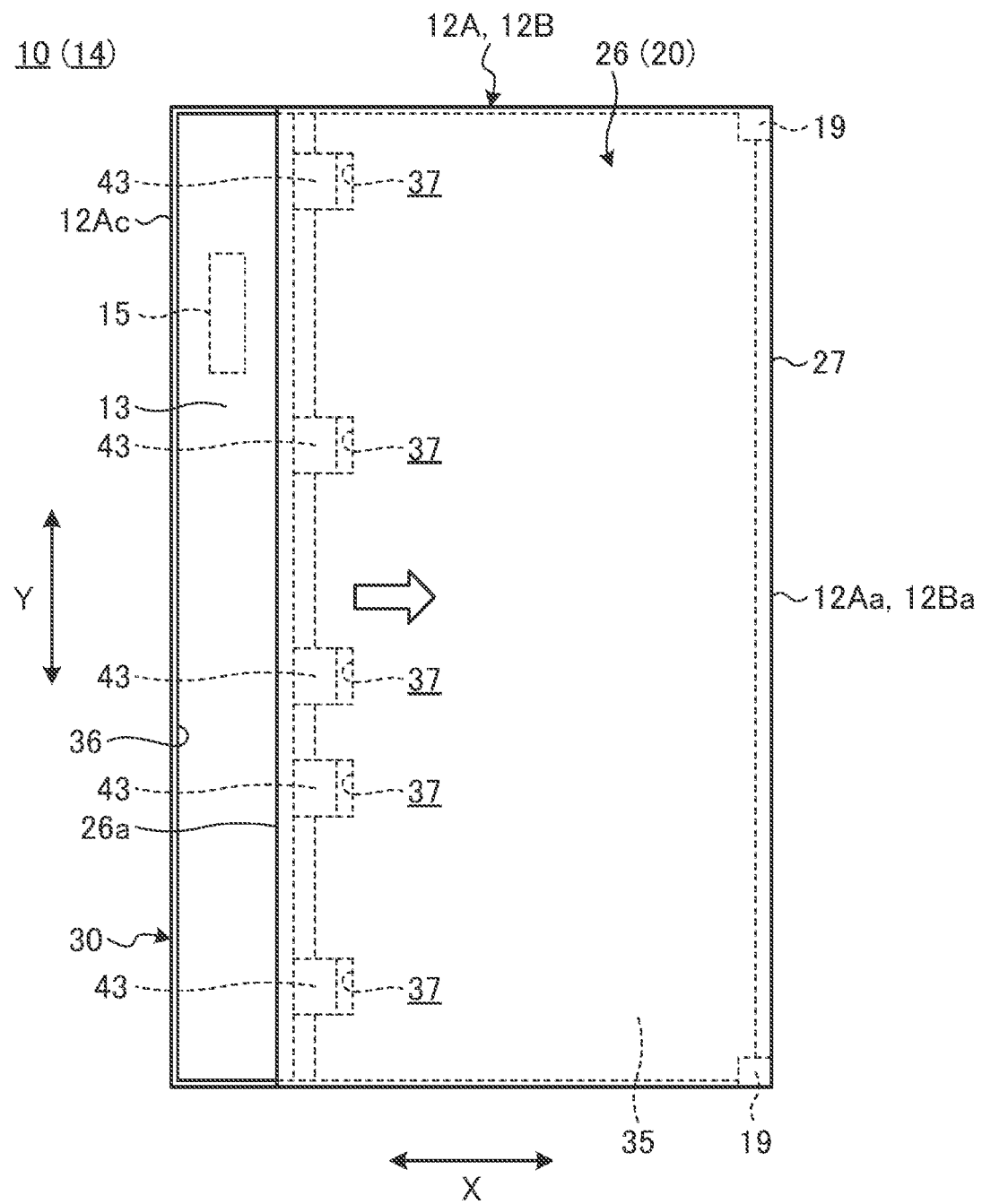
FIG. 3B is a plan view of the portable information device of FIG. 3A that is in the folded form viewed from the first chassis.

Next, the configuration of the cover member 14 will be described. FIG. 3A is a plan view of the portable information device 10 in the flat plate form viewed from the cover member 14. FIG. 3B is a plan view of the portable information device 10 of FIG. 3A in the folded form viewed from the first chassis 12A.

As illustrated in FIGS. 1 to 3B, the cover member 14 covers the outer faces (rear surfaces) 12Ab and 12Bb of the chassis 12A and 12B. In the usage form (see FIG. 2A), the cover member 14 covers the entire outer faces 12Ab and 12Bb. In the laptop form and storage form (see FIGS. 2B and 2C), the cover member 14 covers most of the outer face 12Ab and the entire outer face 12Bb.

The cover member 14 includes a base cover 20, a stand cover 22, and a hinge 24. The covers 20 and 22 extend in the X direction with the hinge 24 interposed therebetween. In the usage form, the covers 20 and 22 cover the entire outer faces 12Ab and 12Bb, that is, from the open end 12Ac of the first chassis 12A to the open end 12Bc of the second chassis 12B. The open ends 12Ac and 12Bc are located on the opposite sides of the adjacent ends 12Aa and 12Ba in the X direction, respectively, and extend in the Y direction.

The base cover 20 has a slide cover section 26, a bent cover section 27, and a fixed cover section 28 placed in this order in the direction from the first chassis 12A to the second chassis 12B.

The slide cover section 26 is a thin plate-like member that is movable relative to the outer face 12Ab of the first chassis 12A and the decorative plate 13 in the X direction. In the flat plate form illustrated in FIGS. 2A and 3A, the distal end 26a of the slide cover section 26 coincides with the open end 12Ac of the first chassis 12A. The distal end 26a is located on the opposite side of the boundary line B1 with the bent cover section 27 in the X direction and extends in the Y direction. In the flat plate form, the entire surface or substantially the entire surface of the decorative plate 13 is covered with the slide cover section 26 (see FIG. 3A). In the laptop form and the folded form illustrated in FIGS. 2B and 2C, the slide cover section 26 slides to a position where the distal end 26a retracts from the open end 12Ac toward the adjacent end 12Aa. In the laptop form and the folded form, the cover member 14 retracts until most of the decorative plate 13 is exposed, so as to let the light of the light emitting module 15 transmit to the outside (see FIG. 3B).

The slide cover section 26 is supported at the first chassis 12A via a slide mechanism having a rail and a slider that slides in the X direction along the rail. In one example, this slide mechanism is configured so that the rail is fixed to the slide cover section 26 and the slider is fixed to the first chassis 12A. With this configuration, the slide mechanism connects the slide cover section 26 to be movable relative to the first chassis 12A.

The bent cover section 27 is in a belt-like region that is narrow in the X direction and extends in the Y direction, and is placed at a position over the adjacent ends 12Aa and 12Ba of the chassis 12A and 12B. The bent cover section 27 is bendably connected to the slide cover section 26 at the boundary line B1 that extends in the Y direction and is closer to the first chassis 12A. The bent cover section 27 is bendably connected to the fixed cover section 28 at the boundary line B2 that extends in the Y direction and is closer to the second chassis 12B. The bent cover section 27 has flexibility as a whole, and connects to the slide cover section 26 and the fixed cover section 28 so that these cover sections are relatively rotatable. The bent cover section 27 is a flexible hinge for rotating the cover member 14 while following the rotational motion between the chassis 12A and 12B. The bent cover section 27 is in a bent region having a width dimension in the X direction that can cover at least a portion between the adjacent ends 12Aa and 12Ba of the chassis 12A and 12B in the folded form illustrated in FIG. 2C.

The fixed cover section 28 is a thin plate-like member that covers the outer face 12Bb of the second chassis 12B together with a part of the bent cover section 27 and the stand cover 22. The fixed cover section 28 has a substantially line-symmetrical shape with the stand cover 22, and has a substantially trapezoidal shape in a plan view in the present embodiment. The fixed cover section 28 is fixed relative to the outer face 12Bb of the second chassis 12B. The fixed cover section 28 in the present embodiment is directly fixed to the outer face 12Bb. The fixed cover section 28 is adjacent to the stand cover 22 via the hinge 24.

The stand cover 22 is rotatable relative to the fixed cover section 28 of the base cover 20 and the outer face 12Bb of the second chassis 12. The stand cover 22 of the present embodiment connects to the outer face 12Bb of the second chassis 12B via the hinge 24.

As illustrated in FIGS. 2A to 3A, the stand cover 22 has a substantially line-symmetrical shape with the fixed cover section 28, and has a substantially trapezoidal shape in a plan view in the present embodiment. The stand cover 22 has an edge close to the fixed cover section 28, and this edge connects to the hinge 24. The stand cover 22 has another edge 22a away from the hinge 24, and the edge 22a coincides with the open end 12Bc of the second chassis 12B.

As the hinge 24 rotates, the stand cover 22 is movable in a direction gradually separated from the outer face 12Bb from the storage position (0 degree) at which the edge 22a abuts on the outer face 12Bb. This allows the stand cover 22 to move between the storage position extending over the outer face 12Bb (see FIGS. 2A and 3A) and the standing position protruding from the outer face 12Ab.

The stand cover 22 at an appropriate angle (standing position) relative to the fixed cover section 28 functions as a stand for keeping the standing posture of the portable information device 10 in the flat plate form. In the standing position, the bottom edge 22b of the stand cover 22, which is the lower bottom of the trapezoid, comes in contact with the desk surface, and this allows the portable information device 10 to keep a predetermined standing posture that is slightly tilted toward the outer faces 12Ab and 12Bb.

The hinge 24 rotatably connects the stand cover 22 relative to the base cover 20 and the second chassis 12B. In one example, the hinge 24 includes a bracket fixed to the second chassis 12B, a bracket fixed to the stand cover 22, and a hinge shaft that rotatably supports these two brackets with a predetermined rotational torque.

As described above, the decorative plate 13 is fixed to the outer face 12Ab, and most of the decorative plate 13 is exposed to the outside in the laptop form and the folded form. Therefore, if the decorative plate 13 is attached to the outer face 12Ab with a fastener such as a screw, such a screw is exposed and the appearance quality deteriorates. Note here that it is difficult to fasten the decorative plate 13 of the present embodiment with fasteners such as screws because the decorative plate 13 is made of glass.

Figure 4:
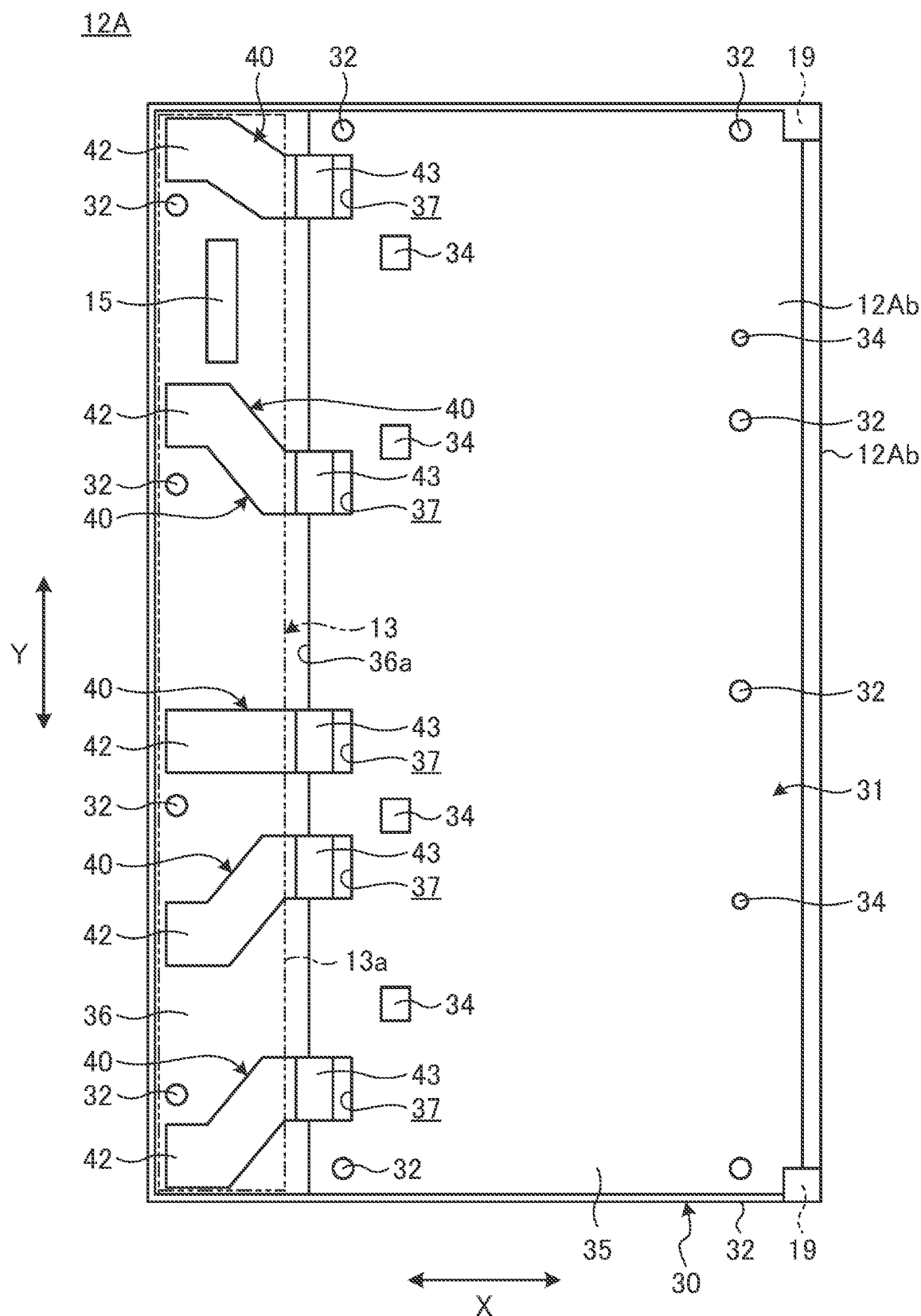
FIG. 4 is a schematic plan view of the first chassis viewed from the outer face.
Figure 5:
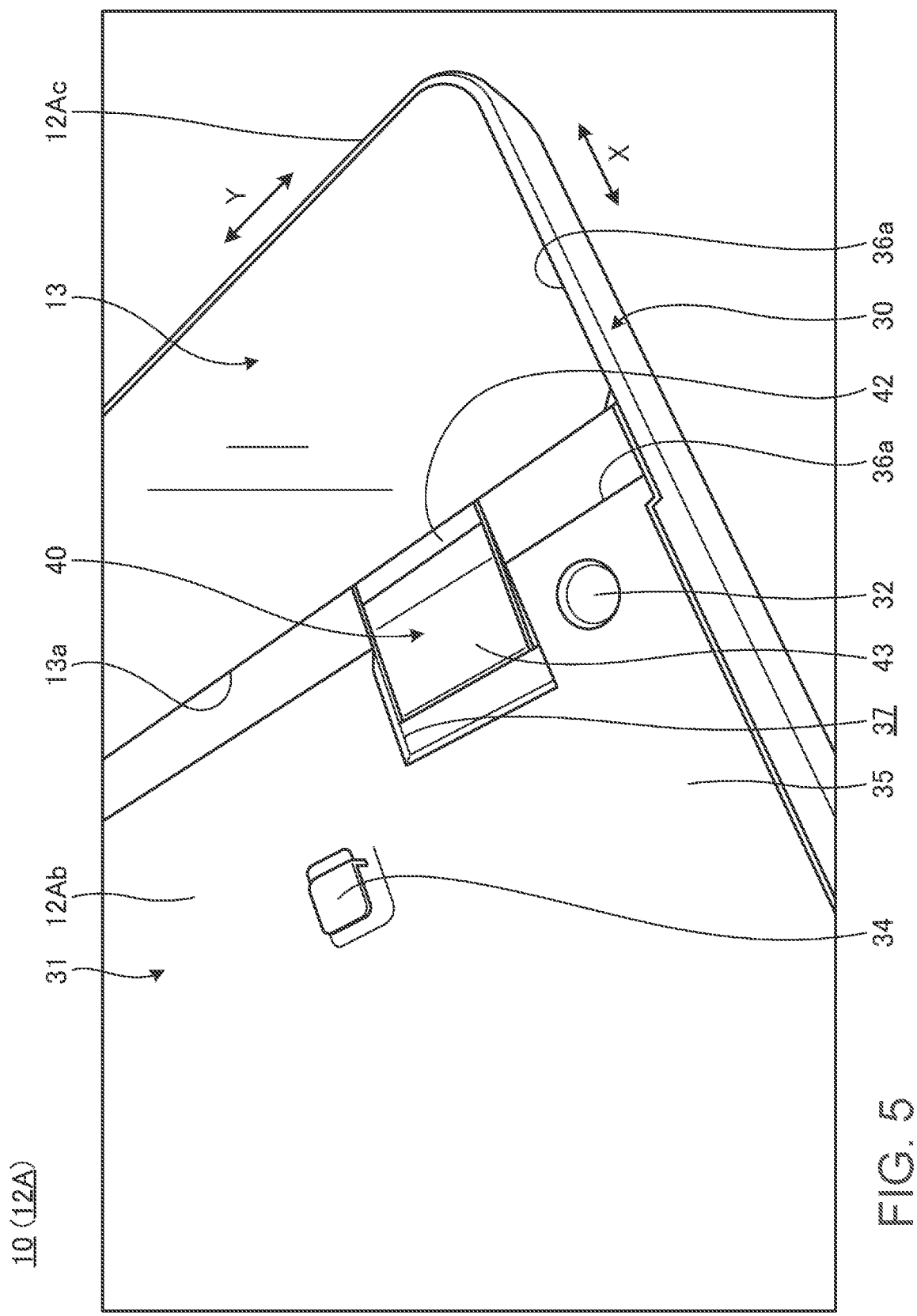
FIG. 5 is an enlarged perspective view of the decorative plate of the first chassis and its surroundings.

The following describes the mounting structure of the decorative plate 13. FIG. 4 is a schematic plan view of the first chassis 12A viewed from the outer face 12Ab. FIG. 4 illustrates the decorative plate 13 with the alternate long and two short dashes line, and omits the cover member 14. FIG. 5 is an enlarged perspective view of the decorative plate 13 of the first chassis 12A and its surroundings.

First, a specific configuration of the first chassis 12A and its outer face 12Ab will be described. As illustrated in FIGS. 4 and 5, the first chassis 12A includes a frame 30 defining the outer peripheral side face and an outer-face cover 31 defining the outer face 12Ab. The frame 30 has a standing wall like a frame. The outer-face cover 31 is a plate-like member that closes the opening of the frame 30 at the outer face 12Ab. The surface-side opening of the frame 30 is closed by the display 16 and a plate supporting the display 16.

The outer-face cover 31 is fastened to the frame 30 with a plurality of screws 32 placed along the outer peripheral edge thereof. Each screw 32 is screwed into a corresponding one of the internal-screw holes formed in various parts of the frame 30. Reference numeral 34 in FIG. 4 denotes a hook or a screw hole for mounting the above-mentioned slide mechanism that slidably supports the slide cover 26 relative to the outer face 12Ab.

The outer-face cover 31 has a base 35, a plate arrangement section 36, and a plurality of recesses 37. The base 35 occupies most of the outer-face cover 31. The base 35 extends in the X direction from the adjacent end 12Aa to a position close to the plate arrangement section 36 that is adjacent to the open end 12Ac.

The plate arrangement section 36 is a portion to attach the decorative plate 13. The plate arrangement section 36 is placed at a position of the outer-face cover 31 facing the open end 12Ac. The plate arrangement section 36 is a recessed part that is slightly lower than the base 35. The plate arrangement section 36 is in a belt-like region having a certain width in the X direction and extending in the Y direction. A step 36a is defined at the boundary between the plate arrangement section 36 and the base 35. The decorative plate 13 is placed at the plate arrangement section 36, and is fixed to the bottom face (outer face 12Ab) with a plurality of pieces of double-sided adhesive tape 40. The decorative plate 13 is placed at the plate arrangement section 36 so that the edge 13a close to the adjacent end 12Aa faces the step 36a with a small gap therebetween. The structure of the double-sided adhesive tape 40 will be described later.

Each recess 37 is a rectangular U-shaped recess formed by slightly lowering the height of the base 35 at a position facing the step 36a. Each recess 37 opens to the step 36a and faces the edge 13a of the decorative plate 13 that is placed at the plate arrangement section 36. The recess 37 stores a part (tab 43) of the double-sided adhesive tape 40.

Next, the following describes a specific mounting structure of the decorative plate 13. As illustrated in FIG. 4, various components such as the light emitting module 15 and the screws 32 are placed on the rear surface of the decorative plate 13. The decorative plate 13 has a function of preventing these components from being exposed when the slide cover 26 retracts (see FIGS. 4 and 5). While hiding the light emitting module 15 from the appearance in this way, the decorative plate 13 also functions as a light transmitting window that transmits the emitted light.

As described above, the decorative plate 13 is fixed to the bottom surface of the plate arrangement section 36 with the double-sided adhesive tape 40. In one example, the decorative plate 13 of the present embodiment is fixed with five pieces of the double-sided adhesive tape 40.

Figure 6:
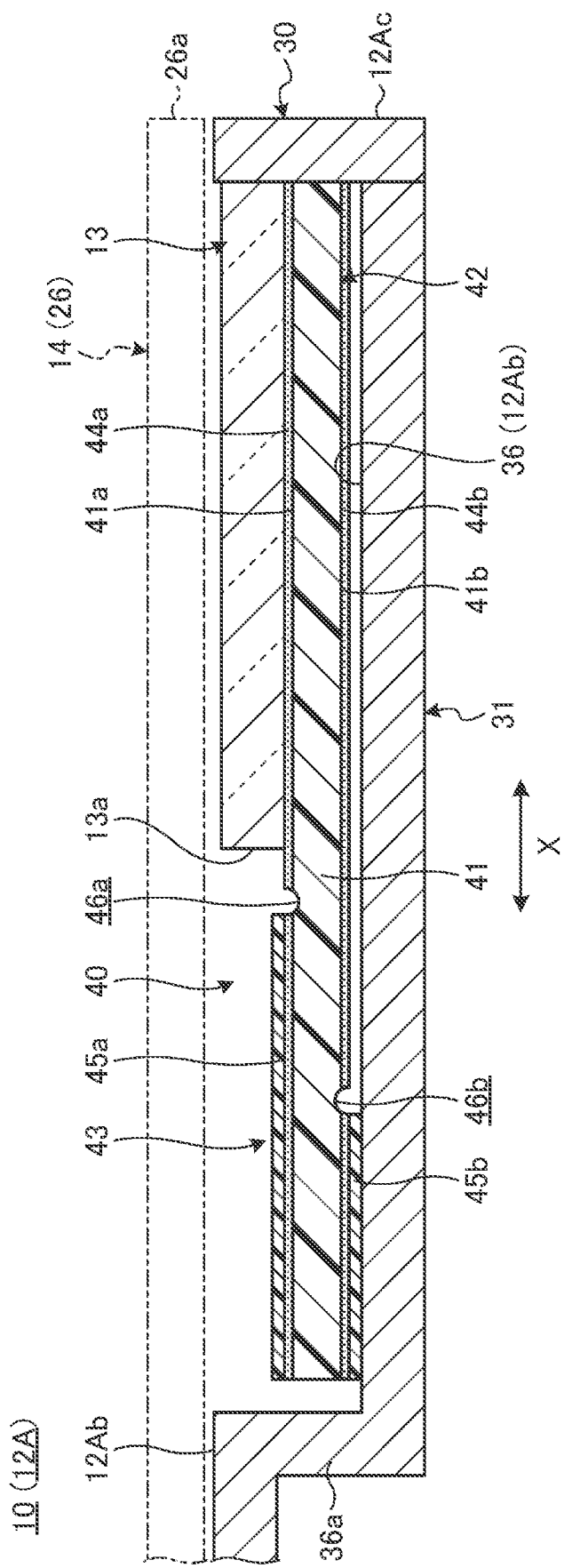
FIG. 6 is a schematic enlarged side sectional view of the decorative plate, the double-sided adhesive tape and their surroundings.

FIG. 6 is a schematic enlarged side sectional view of the decorative plate 13, the double-sided adhesive tape 40 and their surroundings. As illustrated in FIG. 6, the double-sided adhesive tape 40 has a substrate 41, an adhesive portion 42 on one end of the substrate 41, and a tab 43 on the other end. The double-sided adhesive tape 40 is a component also called stretch release tape, stretch double-sided tape, or stretchable tape. The double-sided adhesive tape 40 enables adhesive fixation between target objects (between the decorative plate 13 and the plate arrangement section 36 in this embodiment) at the adhesive portion 42, and enables stretch-release of the adhesive portion 42 by pulling the tab 43.

In one example, the substrate 41 includes a stretchable resin sheet. The substrate 41 comes with an adhesive layer 44*a* on a first face 41*a* and an adhesive layer 44*b* on a second face 41*b*. In the configuration example of FIG. 6, the first face 41*a* is the surface of the substrate 41 and faces the decorative plate 13. The second face 41*b* is the rear surface of the substrate 41 and faces the plate arrangement section 36 (outer face 12Ab).

The adhesive portion 42 is compressed between the decorative plate 13 and the bottom surface (outer face 12Ab) of the plate arrangement section 36 for adhesively fixing of them. The adhesive portion 42 is a portion at one end of the substrate 41 where the adhesive layers 44*a* and 44*b* on both faces 41*a* and 41*b* are exposed.

The tab 43 is a portion to let the user hold for a stretch release operation of the double-sided adhesive tape 40. The tab 43 is formed by covering a part of the adhesive layers 44*a* and 44*b* on both faces 41*a* and 41*b* with release paper 45*a* and 45*b*, respectively. With this configuration, the faces of the tab 43 do not have adhesiveness and so become a portion that the user can hold.

The double-sided adhesive tape 40 has a groove 46*a* on the first face 41*a* and a groove 46*b* on the second face 41*b*. The groove 46*a* of the first face 41*a* is a groove-like recess along the boundary line between the adhesive portion 42 and the release paper 45*a* and extending in the width direction (Y direction) of the double-sided adhesive tape 40. The groove 46*b* of the second face 41*b* is a groove-like recess along the boundary line between the adhesive portion 42 and the release paper 45*b* and extending in the width direction (Y direction) of the double-sided adhesive tape 40.

The grooves 46*a* and 46*b* are positioned so as not to overlap each other in the thickness direction of the substrate 41. Specifically, the grooves 46*a* and 46*b* are displaced from each other in the longitudinal direction of the substrate 41. In the configuration example illustrated in FIG. 6, the groove 46*b* on the second face 41*b* is located closer to the distal end of the tab 43 (the left end in the drawing) than the groove 46*a* on the first face 41*a*. That is, the groove 46*a* is closer to the adhesive portion 42 than the groove 46*b*.

These grooves 46*a* and 46*b* are dents and cuts formed during the manufacturing process of the double-sided adhesive tape 40. Specifically, the method for manufacturing such double-sided adhesive tape 40 typically includes the following two examples.

First, the first manufacturing method attaches release paper of the same quality as the release paper 45*a*, 45*b* to the entire faces of the adhesive layers 44*a*, 44*b* of the substrate 41, and then inserts a cutting tool at the boundary line between the adhesive portion 42 and the tab 43 of both faces 41*a* and 41*b*. This makes cuts in the release paper to separate the adhesive portion 42 and the tab 43. Then, the method peels off the release paper on the adhesive portion 42 along these cuts while leaving the release paper 45*a* and 45*b* on the tab 43. This completes the manufacturing of the double-sided adhesive tape 40.

Next, the second manufacturing method attaches the release paper 45*a*, 45*b* to form the tab 43 on a part of the adhesive layers 44*a*, 44*b* of the substrate 41, and then covers the entire both faces of the tape with protective film. The method then presses both faces with a roller via the protective film to press the protective film against the adhesive portion 42 and at the same time firmly attach the release paper 45*a* and 45*b* to the adhesive layers 44*a* and 44*b*. This completes the manufacturing of the double-sided adhesive tape 40.

In this way, the first manufacturing method inserts the cutting tool into the substrate 41 when cutting the release paper with the cutting tool, and so forms the grooves 46*a* and 46*b*. The second manufacturing method pushes the edges of the release paper 45*a*, 45*b* of the tab 43 into the substrate 41 when pressing the protective film with a roller, and so forms the grooves 46*a* and 46*b*.

The shape and number of pieces of the double-sided adhesive tape 40 can be changed as appropriate depending on the space and the object to be fixed. As illustrated in FIG. 4, the double-sided adhesive tape 40 of the present embodiment has a crank shape or a linear shape. The crank-shaped double-sided adhesive tape 40 is suitable for firmly fixing the decorative plate 13 while diverting it from the screws 32 in various places. All pieces of the double-sided adhesive tape 40 may have a crank shape, for example, so that all of the parts have a common shape.

As illustrated in FIGS. 5 and 6, the adhesive portion 42 of the double-sided adhesive tape 40 is caught between the decorative plate 13 and the bottom surface (outer face 12Ab) of the plate arrangement section 36 to fix the decorative plate 13 to the first chassis 12A. Note that FIG. 6 illustrates the double-sided adhesive tape 40 with a straight line, and so illustrates the adhesive portion 42 not in contact with the bottom surface (outer face 12Ab) of the plate arrangement section 36. Actually, however, the adhesive portion 42 is pressed by the decorative plate 13 so that the adhesive layer 44*b* comes in contact with the bottom surface for adherence (the same applies to FIG. 7).

At this time, the tab 43 projects from the edge 13*a* of the decorative plate 13, and is stored in the recess 37. For stretch releasing, the user may hold the tab 43 of the double-sided adhesive tape 40 with fingertips or a tool to pull the tab 43. This allows the user to easily release both the adhesive layers 44*a* and 44*b* of the adhesive portion 42, and smoothly pull out the double-sided adhesive tape 40 from between the decorative plate 13 and the outer face 12Ab.

Similarly, to the grooves 46*a* and 46*b*, conventionally used double-sided adhesive tape has grooves on both faces, which are formed during the manufacturing process, but these grooves are formed at a position where they overlap each other in the thickness direction. When the user pulls the double-sided adhesive tape while holding the tab 43, such conventional double-sided adhesive tape breaks along the vertically coinciding grooves, and this may cause a failure in smooth releasing.

In contrast, the double-sided adhesive tape 40 of the present embodiment has the displaced grooves 46*a* and 46*b* on both faces 41*a* and 41*b* that do not overlap each other.

The double-sided adhesive tape 40 therefore suppresses a break along the grooves 46a and 46b during the stretch release, and so enables smooth and thorough releasing. The grooves 46a and 46b that do not overlap each other mean not only that two grooves do not overlap at all in the thickness direction of the double-sided adhesive tape 40, but also that the grooves 46a and 46b intersect in a plan view and overlap only at one point, for example. That is, the positional relationship between the grooves 46a and 46b may be any one as long as it can suppress a break of the substrate 41, and may be other than the relationship where the grooves 46a and 46b are parallel to each other and completely coincide with each other.

Moreover, the double-sided adhesive tape 40 of the present embodiment has a configuration so that the tab 43 is placed in the recess 37 and does not protrude above the outer face 12Ab. This configuration prevents the slide cover 26, which slides over the tab 43, from being caught by the tab 43. Otherwise, the tab 43 will be rolled up. The slide cover 26 extends from the outer face 12Ab (base 35) of the first chassis to the surface of the decorative plate 13 while crossing over the tab 43. The decorative plate 13 is partially exposed depending on the moving position of the slide cover 26. In contrast, the tab 43 is always covered by the slide cover 26 within the moving range of the slide cover 26. This means that the slide cover 26 always slides over the tab 43, and so the recess 37 has a noticeable effect of preventing the rolling-up of the tab 43. For maintenance, the tab 43 appears by removing the slide cover 26. The portable information device 10 therefore enables easy removal of the double-sided adhesive tape 40 and detachment of the decorative plate 13 for replacement of internal components or maintenance.

The double-sided adhesive tape 40 is configured so that the groove 46b on the second face 41b adhering to the outer face 12Ab is located closer to the distal end of the tab 43 than the groove 46a on the first face 41a adhering to the decorative plate 13. The double-sided adhesive tape 40 has a part of the adhesive layer 44b on the second face 41b of the substrate 41 that is exposed and is adhesively fixed to the outer face 12Ab. This configuration therefore more reliably suppresses the rolling-up of the tab 43 when the slide cover 26 slides.

Figure 7:
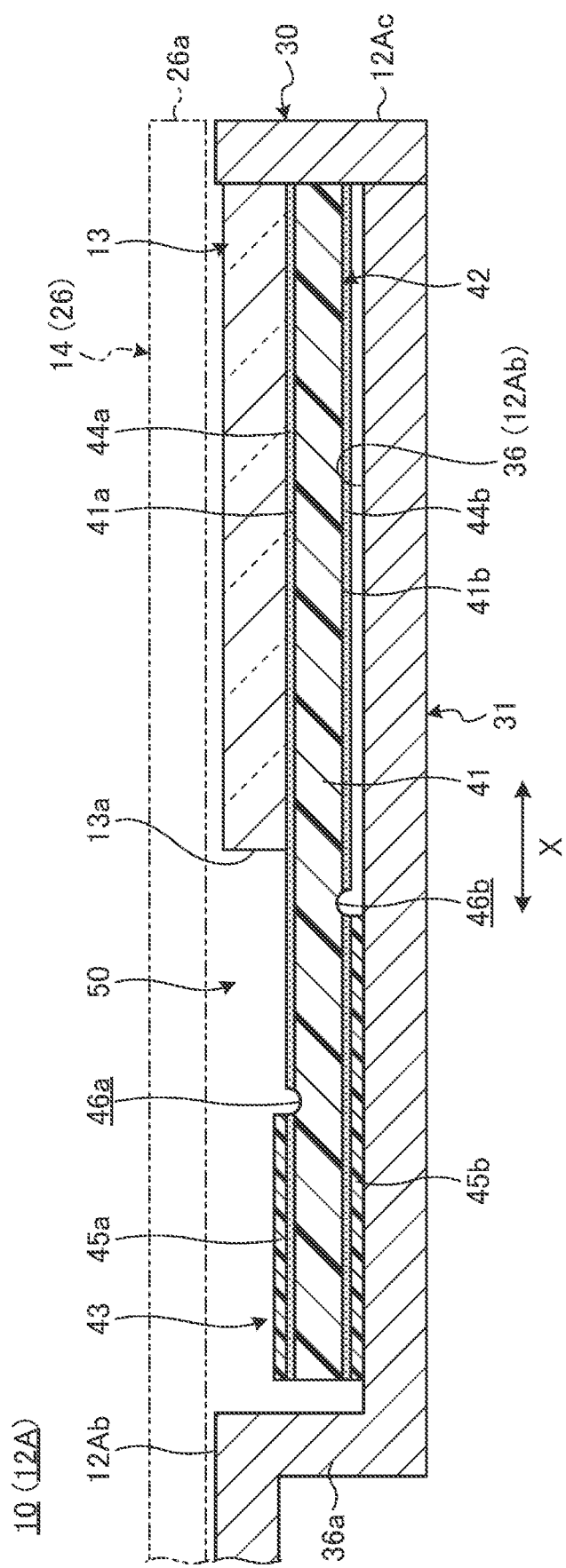
FIG. 7 is a schematic enlarged side sectional view of the decorative plate fixed with double-sided adhesive tape according to a modified example and their surroundings.

FIG. 7 is a schematic enlarged side sectional view of the decorative plate 13 fixed with double-sided adhesive tape 50 according to a modified example and their surroundings. For the double-sided adhesive tape 50 of FIG. 7, like reference numerals indicate like parts having the same or similar functions and advantageous effects of the double-sided adhesive tape 40 of FIG. 6, and their detailed description is omitted.

The double-sided adhesive tape 50 of FIG. 7 is reversed in the position of the grooves 46a and 46b in the longitudinal direction from the double-sided adhesive tape 40 of FIG. 6. In other words, in the configuration example illustrated in FIG. 7, the groove 46a on the first face 41a is located closer to the distal end of the tab 43 (the left end in the drawing) than the groove 46b on the second face 41b. That is, the groove 46b is closer to the adhesive portion 42 than the groove 46a. Such double-sided adhesive tape 50 suppresses the rolling-up of the tab 43 because the groove 46a on the first face 41a, which tends to be the starting point of the rolling-up of the tab 43, is close to the distal end of the tab 43.

The present invention is not limited to the above-described embodiments, and can be modified freely without deviating from the scope of the present invention.

The above embodiments describe the examples where the double-sided adhesive tape 40, 50 is used for fixing the decorative plate 13. The double-sided adhesive tape 40, 50 may be used for adhesively fixing other targets installed in the chassis 12A and 12B, such as a battery device.

The above embodiments describe the examples where the cover member 14 includes the stand cover 22. When the cover member 14 does not require the stand function, the stand cover 22 may be omitted.

The above describes the portable information device 10 that is foldable into half like a book as an example. Other than the configuration of folding the chassis of the same shape double, the present invention is applicable to various foldable portable information devices including: a double door configuration in which small chassis are foldably connected to the left and right edges of a large chassis; an S-shaped folding configuration in which chassis with different folding directions are connected to the left and right edges of a single chassis; and a J-shaped folding configuration in which a small chassis is foldably connected to one of the left and right edges of a large chassis. The number of connected chassis may be four or more. In this case, the cover member 14 may be configured to cover the outer face of all or part of each chassis, and two or more cover members may be used at the same time.

The invention claimed is:

1. A double-sided adhesive tape that is releasable by stretching, comprising:
    an adhesive portion including adhesive layers on a first face and on a second face of a substrate, the adhesive portion being configured to adhesively fix between two adhesive targets; and
    a tab including pieces of release paper covering a part of the adhesive layers on the first face and on the second face of the substrate and which pieces of release paper are configured to enable a user to hold the tab for stretch release of the adhesive portion from between the two adhesive targets,
    the first face has a first groove extending along a boundary line between the adhesive portion and the pieces of release paper,
    the second face has a second groove extending along the boundary line between the adhesive portion and the pieces of release paper,
    the first groove and the second groove being positioned so as not to overlap each other in a thickness direction of the substrate.

2. The double-sided adhesive tape according to claim 1, wherein
    the substrate includes the adhesive portion at one end of the substrate and the tab at an opposite end of the substrate, in a longitudinal direction of the substrate, and
    the first groove and the second groove extend in a width direction orthogonal to the longitudinal direction of the substrate and are displaced to each other in the longitudinal direction.

3. A portable information device comprising:
    a chassis;
    a decorative plate fixed to a part of an outer face of the chassis with double-sided adhesive tape that is releasable by stretching; and
    a cover member that covers the outer face of the chassis and the decorative plate,
    the double-sided adhesive tape having:
        an adhesive portion including adhesive layers on a first face and on a second face of a substrate, the adhesive portion being configured to adhesively fix between the decorative plate and the outer face; and a tab including pieces of release paper covering a part of the adhesive layers on the first face and on the second face of the substrate and which pieces of release paper are configured to enable a user to hold the tab for stretch release of the adhesive portion from between the decorative plate and the outer face, the tab projects from an edge of the decorative plate and is covered by the cover member, the first face has a first groove extending along a boundary line between the adhesive portion and the pieces of release paper, the second face has a second groove extending along the boundary line between the adhesive portion and the pieces of release paper, the first groove and the second groove are positioned so as not to overlap each other in a thickness direction of the substrate.

4. The portable information device according to claim 3, wherein the chassis has a recess on the outer face at a position facing the edge of the decorative plate, and the tab is in the recess.

5. The portable information device according to claim 4, wherein the cover member is supported by the chassis and is be movable relative to the outer face of the chassis and the decorative plate, and extends from the outer face of the chassis to a surface of the decorative plate while crossing over the tab, the decorative plate is partially exposed according to a moving position of the cover member, and the tab is always covered by the cover member within a moving range of the cover member.

6. The portable information device according to claim 3, wherein the substrate includes the adhesive portion at one end of the substrate and the tab at an opposite end of the substrate, in a longitudinal direction of the substrate, and the first groove and the second groove extend in a width direction orthogonal to the longitudinal direction of the substrate and are displaced to each other in the longitudinal direction.

7. The portable information device according to claim 6, wherein the first face of the double-sided adhesive tape is fixed to the decorative plate, and the second face of the double-sided adhesive tape is fixed to the outer face of the chassis, and the second groove is closer to a distal end of the tab than the first groove, in the longitudinal direction.

8. The portable information device according to claim 6, wherein the first face of the double-sided adhesive tape is fixed to the decorative plate, and the second face of the double-sided adhesive tape is fixed to the outer face of the chassis, and the first groove is closer to a distal end of the tab than the second groove, in the longitudinal direction.

9. The portable information device according to claim 3, wherein the decorative plate includes a glass plate.

* * * * *